United States Patent
Gomez et al.

(10) Patent No.: US 9,733,313 B2
(45) Date of Patent: Aug. 15, 2017

(54) METHOD OF OPERATING A GENERATOR CONNECTED TO A POWER SUPPLY NETWORK

(71) Applicant: GE Jenbacher GmbH & Co OG, Jenbach (AT)

(72) Inventors: Jose Gomez, Reutlingen (DE); Erich Kruckenhauser, Muenster (AT); Herbert Schaumberger, Muenster (AT)

(73) Assignee: GE JENBACHER GMBH & CO OG, Jenbach (AT)

( * ) Notice: Subject to any disclaimer, the term of this patent is extended or adjusted under 35 U.S.C. 154(b) by 106 days.

(21) Appl. No.: 14/523,048

(22) Filed: Oct. 24, 2014

(65) Prior Publication Data

US 2015/0115997 A1    Apr. 30, 2015

(30) Foreign Application Priority Data

Oct. 30, 2013    (AT) .................................. A 833/2013

(51) Int. Cl.
*G01R 31/40*    (2014.01)
*F02B 63/04*    (2006.01)
*H02P 9/10*    (2006.01)
*F02D 41/02*    (2006.01)
*F02D 31/00*    (2006.01)

(52) U.S. Cl.
CPC .............. *G01R 31/40* (2013.01); *F02B 63/04* (2013.01); *H02P 9/10* (2013.01); *F02D 31/001* (2013.01); *F02D 41/021* (2013.01); *F02D 2200/1002* (2013.01); *F02D 2200/1012* (2013.01)

(58) Field of Classification Search
CPC ........ G01R 31/40; G01R 31/42; G01R 31/34; G01R 31/343; G01R 31/346
See application file for complete search history.

(56) References Cited

U.S. PATENT DOCUMENTS

| | | | |
|---|---|---|---|
| 2009/0001940 A1* | 1/2009 | Sihler | ....................... H02J 3/24 322/58 |
| 2009/0261599 A1* | 10/2009 | Alston | ................ B60L 15/2045 290/40 B |
| 2013/0261820 A1 | 10/2013 | Meier et al. | |

FOREIGN PATENT DOCUMENTS

| | | |
|---|---|---|
| DE | 762 986 | 3/1953 |
| DE | 969 090 | 4/1958 |
| DE | 197 52 940 | 6/1999 |
| EP | 2 312 741 | 4/2011 |

OTHER PUBLICATIONS

European Search Report (ESR) issued Mar. 9, 2015 in family member European Patent Application No. EP 14 00 3561.
Kumano et al., "Effect of Back-Swing Phenomenon on the Transient Stability of Synchronous Machines", Electrical Engineering in Japan, 109(5):403-410 (1989).

* cited by examiner

*Primary Examiner* — Tung X Nguyen
(74) *Attorney, Agent, or Firm* — GE Global Patent Operation

(57) ABSTRACT

In a method of operating a generator connected to a power supply network, in particular a synchronous generator, during a network fault in the power supply network, in particular during an electric short-circuit, electric excitation of the generator is at least temporarily reduced based on the value of at least one operating parameter of the generator prior to the network fault and/or during the network fault.

20 Claims, 2 Drawing Sheets

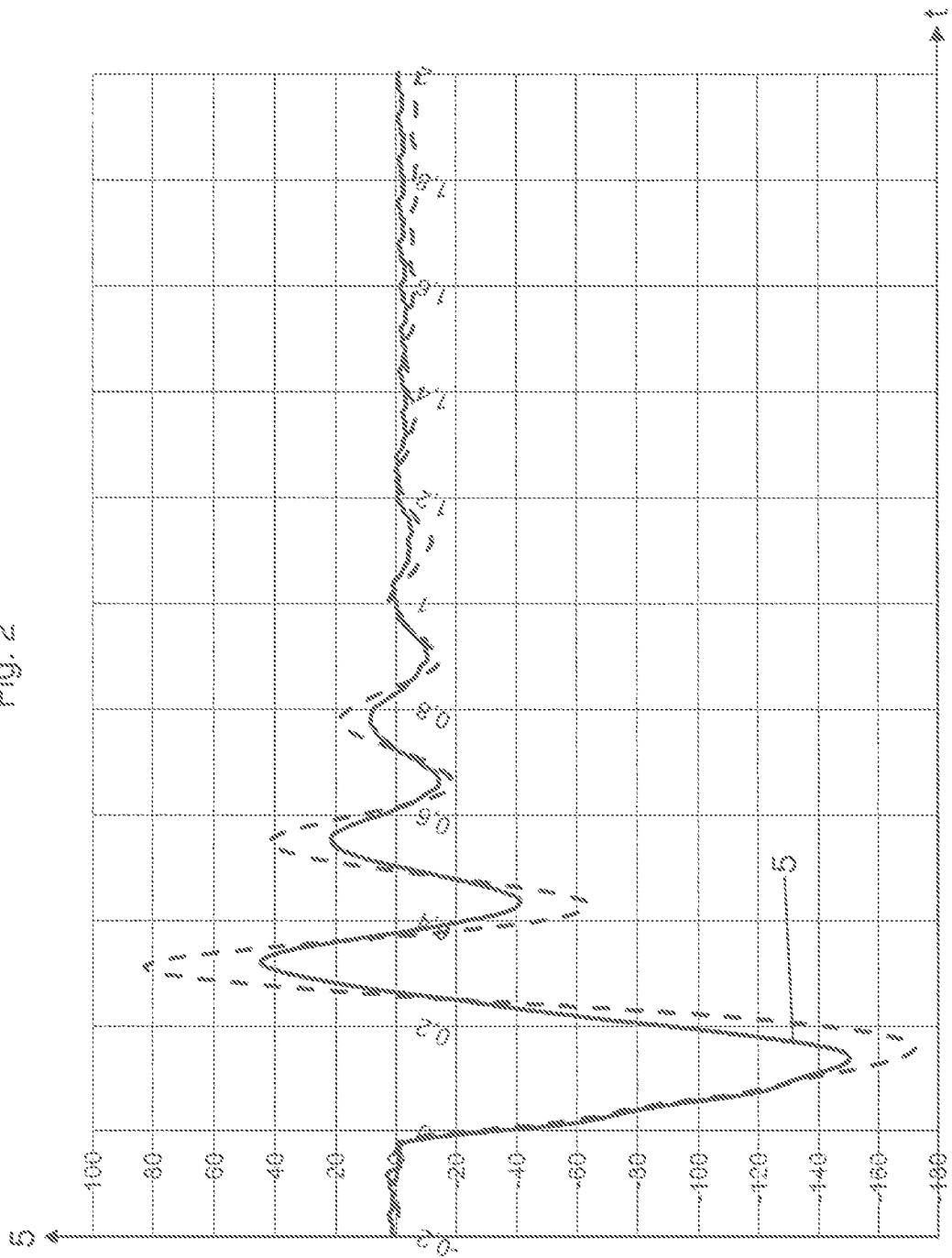

METHOD OF OPERATING A GENERATOR CONNECTED TO A POWER SUPPLY NETWORK

BACKGROUND OF THE INVENTION

The invention concerns a method of operating a generator connected to a power supply network, in particular a synchronous generator, during a network fault in the power supply network, in particular during an electric short-circuit.

During a network fault in a power supply network, in particular during an electric short-circuit and the concomitant drop in network voltage in the power supply network, unwanted changes in operating parameters of an electric generator connected to the power supply network, in particular a synchronous generator, such as changes in the rotary speed or the load angle of the generator, can occur. The term load angle is used as is known to denote the angle between the vector of the rotating magnetic field in the stator of the generator and the vector of the rotating magnetic field in the rotor of the generator.

The drop in the network voltage leads to a significant reduction in the delivery of electric power from the generator to the power supply network. In the case of usual configurations in which a rotor of the generator is connected to an engine shaft, driving the rotor, of an internal combustion engine (for example a gas engine) that drop in electric power can lead to a corresponding increase in the rotary speed of the internal combustion engine and therewith the rotor. As a result, synchronization of the generator with the power supply network can be lost or damage in the generator can even be caused.

Detection of a network fault in the power supply network can be effected for example by the network voltage of the power supply network and/or the electric current fed into the power supply network by the generator and/or the rotary speed of the generator or the internal combustion engine and/or the torque at the engine shaft of the internal combustion engine or at the rotor shaft of the generator being monitored, in which case upon the occurrence of a change in at least one of those monitored operating parameters beyond a predeterminable threshold value a network fault is detected. In that respect, changes which occur can be detected as a network fault only when a plurality of those operating parameters involve corresponding changes beyond predeterminable threshold values, if therefore for example both the network voltage, the electric current and also the rotary speed involve corresponding deviations. The generator can remain connected to the power supply network during a network fault.

The conventional approach for reacting to such network faults is to take suitable measures in order to counteract such an increase in the rotary speed and an increase related thereto in the load angle of the generator. Thus measures are usually taken, which reduce the rotary speed and the load angle. Such a measure by way of example is a reduction in the acceleration moment by an internal combustion engine connected to the generator being correspondingly throttled.

It has been found, however, that the conventional measures are disadvantageous in the event of a network fault in certain situations. Thus, the rotary speed of the generator may not increase upon the occurrence of a network fault but firstly falls. That effect which is known to the man skilled in the art by the English technical term "back-swing" can under some circumstances even lead to pole slippage of the generator. Pole slippage in turn leads to an instability of the generator, in which a mechanical power introduced into the rotor by an internal combustion engine by way of the engine shaft can no longer be converted as desired into electric power by the generator.

SUMMARY OF THE INVENTION

The object of the invention is to avoid the above-described disadvantages and to provide a method of operating a generator during a network fault in the power supply network, that is improved over the state of the art.

According to the invention, it is therefore provided that electric excitation of the generator is at least temporarily reduced based on the value of at least one operating parameter of the generator prior to the network fault and/or during the network fault.

The electric excitation of a generator determines the transmissible electric power and the level of the output voltage of the generator and thus the level of the electric reactive power which is fed into the power supply network by the generator. The higher the generator output voltage during a network voltage drop, the correspondingly higher is the electric power which is fed into the power supply network. Accordingly, the level of the electric power which is fed into the power supply network during a network voltage drop is reduced by the reduction in the electric excitation of the generator. That is advantageous in particular during a network failure in the power supply network, that results in a back-swing effect. In the case of configurations in which an internal combustion engine drives the generator, that means that it is possible to advantageously counteract the imbalance which occurs in the case of a network fault—in particular in the case of a back-swing—between the mechanical power of the internal combustion engine and the electric power delivered by the generator.

The proposed method is advantageous in particular for generators which have an inertia constant of less than or equal to 1.5 Ws/VA, preferably less than or equal to 1 Ws/VA, as the back-swing effect acts more strongly on generators with low inertia constants.

In a preferred embodiment, the generator is coupled to an internal combustion engine, preferably by a coupling device. The internal combustion engine can be for example a reciprocating piston gas engine operated in accordance with the Otto cycle, a diesel engine or a gas turbine.

Deviations in operating parameters of the generator during a network fault frequently occur for the reason that an imbalance occurs between the mechanical power which is introduced into the generator by the internal combustion engine and the electric power which is fed into the power supply network by the generator. In the case of a back-swing effect occurring as a consequence of the network fault, that imbalance can be caused by the electric power being greater than the mechanical power. It is possible to counteract that imbalance by a reduction in the electric excitation of the generator and the concomitant reduction in the delivered electric power.

The excitation of the generator can be reduced by reducing an exciter voltage for the generator or by reducing an exciter current fed to the generator. In that respect, for exciting the generator, it is possible to use an excitation device arranged at or outside the generator. The excitation device can be acted upon with the exciter voltage and can subsequently produce an exciter current which is fed in known manner to corresponding windings of the generator to cause generator excitation.

In accordance with a preferred embodiment of the invention, an electric power delivered to the power supply network by the generator prior to the network fault can be detected as an operating parameter, and excitation is reduced based on the delivered electric power prior to the network fault. In that respect, excitation can be reduced substantially proportionally to a difference in the delivered electric power prior to the network fault in relation to a predeterminable reference value—preferably the rated power—.

A transient rotary speed of the generator and/or the coupling device and/or the internal combustion engine can be detected as the operating parameter during the network fault. Excitation is reduced substantially proportionally to a difference in the transient rotary speed relative to the rotary speed prior to the network fault.

By way of example, it is possible to ascertain a percentage exciter voltage in relation to a predeterminable nominal exciter voltage of 100% in accordance with following formula F1:

$$S3=100\%-(S1_{ref}-S1)*P_{speed},$$

wherein S3 denotes a percentage exciter voltage in relation to a nominal exciter voltage of 100%, $S1_{ref}$ denotes a percentage rotary speed of the generator or the coupling device or the internal combustion engine prior to the network fault in relation to a nominal rotary speed of 100%, S1 denotes the percentage transient rotary speed of the generator or the coupling device or the internal combustion engine during the network fault in relation to a nominal rotary speed of 100% and $P_{speed}$ denotes a positive proportionality factor by which the intensity of the reduction in the exciter voltage can be influenced.

In accordance with a further embodiment, a change in rotary speed of the generator and/or the coupling device and/or the internal combustion engine can be detected as the operating parameter during the network fault, and excitation can be reduced based on the magnitude of the change in rotary speed.

A torque at an engine shaft of the internal combustion engine and/or at a rotor shaft of the generator is detected as the operating parameter during the network fault, and excitation is reduced based on the torque.

In a further preferred embodiment, a load angle of the generator can be detected as the operating parameter during the network fault, and excitation is reduced substantially indirectly proportionally to the magnitude of the detected load angle.

For example a reduced exciter voltage can be ascertained in accordance with following formula F2 in the event of a negative load angle:

$$S3=100\%+(S2/180)*100\%*P_{load\_angle},$$

wherein S3 denotes the exciter voltage which is correspondingly reduced in percentage terms in relation to the nominal exciter voltage of 100%, S2 denotes the measured negative load angle in degrees and $P_{load\_angle}$ denotes a positive proportionality factor by which the intensity of the reduction in the exciter voltage can be influenced.

Preferably, the excitation is reduced at a maximum to a predeterminable minimum excitation. That makes it possible to ensure minimum excitation of the generator. Thus, for example, it is possible to predetermine a minimum value for the parameter S3 of the above-indicated formulae F1 and F2 respectively, below which the percentage exciter voltage is not to fall. That safety measure makes it possible to avoid critical operating states of the internal combustion engine.

According to a particularly preferred embodiment, oscillations in an operating parameter of the generator during the network fault are detected, and excitation of the generator is reduced if the oscillations exceed a predeterminable intensity. In that respect, oscillations in a load angle of the generator can be detected, and excitation of the generator is reduced if the oscillations are of an amplitude of more than 2 degrees, preferably more than 10 degrees.

In the case of a network fault which results in a back-swing effect, it is advantageous to increase the mechanical power of the internal combustion engine in order to compensate for the increase in electric power fed into the power supply network by the generator. If the reaction time of the corresponding control members of the internal combustion engine in relation to the time duration of the network fault is too great the control members of the internal combustion engine can preferably be kept in their positions so that at least the mechanical power introduced by the internal combustion engine remains at the level that prevailed prior to the network fault.

BRIEF DESCRIPTION OF THE DRAWINGS

Further details and advantages of the present invention will now be described by the specific description hereinafter. In the drawings:

FIG. 2 shows the variation in respect of time of the load angle of a generator during a network fault in the power supply network.

DETAILED DESCRIPTION OF THE INVENTION

Figure 1:
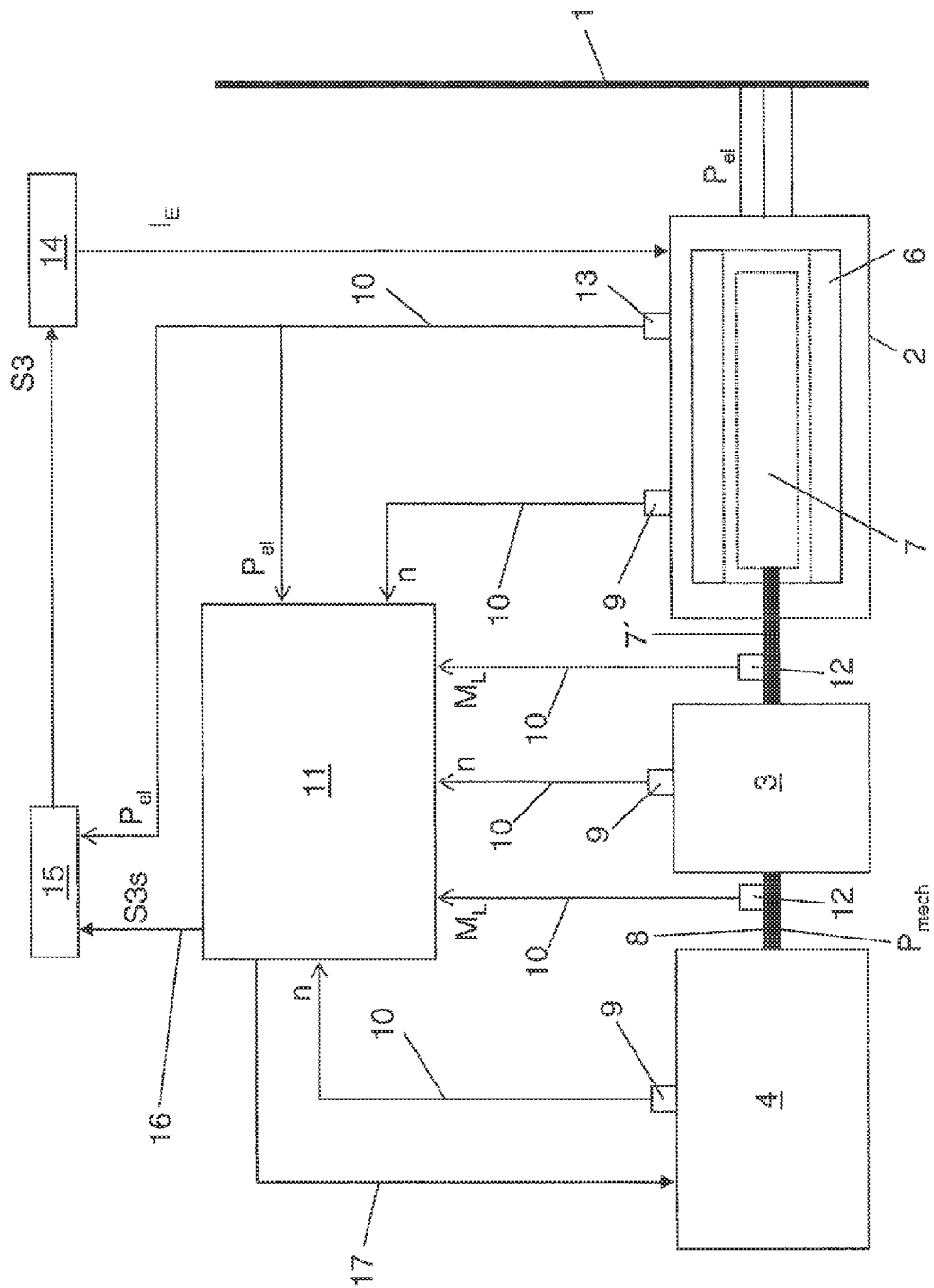
FIG. 1 shows a schematic block circuit diagram of a generator which is electrically connected to a power supply network and which is driven by an internal combustion engine.

FIG. 1 is a schematic block circuit diagram showing an electric generator 2 electrically connected to a power supply network 1 of three-phase configuration. The generator 2 is in the form of a synchronous generator and has a stator 6 and a rotor 7 arranged rotatably within the stator 6. The three phases of the power supply network 1 are connected in a known manner to windings on the stator 6 of the generator 2. The power supply network 1 can be a public power supply network which predetermines the network frequency or, for example, a local power supply network in an island mode of operation in which the network frequency is predetermined by the generator 2. The rotor 7 or rotor member of the generator 2 is substantially non-rotatably connected to an engine shaft 8 of an internal combustion engine 4 by a coupling device 3. The internal combustion engine 4 can be, for example, a stationary gas engine which can be in the form of a spark-ignition reciprocating piston engine operated on the Otto cycle.

A mechanical power $P_{mech}$ delivered by the internal combustion engine 4 is introduced into the generator 2 by the engine shaft 8, converted in the generator 2 into electric power $P_{el}$ and subsequently the electric power $P_{el}$ is delivered to the power supply network 1.

In the illustrated example, rotary speed sensors 9 which are known in the state of the art are arranged at the generator 2, at the coupling device 3 and at the internal combustion engine 4, by which the rotary speed n of the engine shaft 8 or of the rotor 7 can be detected and signaled by way of suitable signal lines 10 to a control device 11. Also arranged here at the engine shaft 8 and at the rotor shaft 7' of the rotor 7 are torque sensors 12 with which the mechanical torque $M_L$ at the engine shaft 8 upstream of the coupling device 3 and at the rotor shaft 7' downstream of the coupling device 3 can be detected and signaled by way of suitable signal lines 10 to the control device 11. The control device 11 can subsequently ascertain the prevailing load angle 5 of the rotor 7 in a known manner for example from the detected rotary speed n (see FIG. 2). The load angle 5 can also be ascertained by calculation on the basis of generator reactances and measured electrical parameters (voltage, current, power factor).

In addition, arranged on the generator 2 is a power measuring device 13 which is also known in the state of the art and which ascertains the electric power $P_{el}$ fed into the power supply network 1 by the generator 2, and signals the same by a further signal line 10 to the control device 11 and to a voltage regulator 15. In that respect, the power measuring device 13 can ascertain the electric power $P_{el}$ in a known manner from voltage and current measurements.

Here, the rotor 7 of the generator has exciter windings (not shown in greater detail) which are acted upon by an excitation device 14 in the form of a synchronous machine with an electric exciter current $I_E$. The excitation device 14 is acted upon by a voltage regulator 15 with an exciter voltage S3 whereby an exciter current $I_E$ corresponding to the exciter voltage S3 is set for the exciter windings on the rotor 7 of the generator 2.

During a network fault in the power supply network 1, in particular during a network fault which results in a back-swing effect, the control device 11, based on the value of at least one operating parameter of the generator 2 prior to the network fault and/or during the network fault, ascertains a correspondingly reduced maximum voltage S3s which is to be output as the maximum exciter voltage S3 by the voltage regulator 15, and signals that maximum voltage S3s to the voltage regulator 15 by way of a control line 16. Due to the maximum exciter voltage S3 which is limited by the maximum voltage S3s and which can now be output by the voltage regulator 15, it is possible to achieve a reduction in the excitation of the generator 2, that results therefrom, insofar as in that way the exciter current $I_E$ provided by the excitation device 14 for the exciter windings on the rotor 7 of the generator 2 is correspondingly reduced. The exciter voltage S3 can be a percentage exciter voltage in relation to a nominal exciter voltage of 100%. In that respect, the percentage exciter voltage S3 which is reduced in relation to the nominal exciter voltage can be ascertained by the control device 11 and/or the voltage regulator 15 in accordance with foregoing formulae F1 and F2 respectively.

Control members (not shown in greater detail) of the internal combustion engine 4 can be actuated by an engine control line 17 in order to change the mechanical power delivered by the internal combustion engine 4. The control members can be, for example, a throttle flap, a turbocharger bypass valve or a waste gate. Thus, in the case of a back-swing, the mechanical power output of the internal combustion engine 4 can be increased by way of the engine control line 17 in order to compensate for the increase in the electric power fed into the power supply network 1 by the generator 2. If the reaction time of the corresponding control members of the internal combustion engine 4 in relation to the time duration of the network fault is too great, the control members of the internal combustion engine 4 can preferably be kept in their positions so that at least the mechanical power introduced by the internal combustion engine 4 remains at the level that prevailed prior to the network fault.

FIG. 2 shows the variation in respect of time of the load angle 5 of the rotor 7 of the generator 2 in degrees in relation to time t in seconds during a network fault which results in a back-swing effect. As can be seen from the illustration, oscillations in the load angle 5 occur during the network fault. The broken-line configuration shows the oscillations in the load angle 5 when applying conventional control measures in relation to the network fault and the solid line shows the configuration of the load angle 5 when applying the proposed method. As can be clearly seen when applying the proposed method, the amplitude of the oscillation in the load angle 5 is reduced, whereby this gives overall a higher degree of stability of the generator 2 during the network fault. It is to be noted in relation to this illustration that a load angle 5 of + or −180 degrees represents the slippage limit and therefore, as can be seen, the generator 2 is already brought very close to the slippage limit without the proposed method.

Overall, the proposed method makes it possible to increase the stability of electric generators or power plants comprising at least one electric generator driven by an internal combustion engine in situations in which a back-swing effect occurs, triggered by a network fault. During such fault situations with a back-swing effect, conventional control measures are counter-productive as conventional control measures do not take into account the back-swing effect and for example increase generator excitation instead of reducing it.

Preferably, the proposed method can be used in relation to a network fault only during the occurrence of a back-swing effect and conventional control measures can be adopted again after the back-swing effect dies away.

The invention claimed is:

1. A method of operating a generator connected to a power supply network during a network fault in the power supply network, said method comprising:
   at least temporarily reducing electric excitation of the generator based on a value of at least one operating parameter of the generator at at least one point in time (i) prior to the network fault or (ii) during the network fault, said at least temporarily reducing the electric excitation of the generator comprising limiting a maximum exciter voltage of an exciter of the generator.

2. The method as set forth in claim 1, wherein the generator has an inertia constant of less than or equal to 1.5 Ws/VA.

3. The method as set forth in claim 1, wherein the generator is coupled to an internal combustion engine by a coupling device.

4. The method as set forth in claim 1, wherein excitation of the generator is reduced by reducing an exciter voltage for the generator or by reducing an exciter current fed to the generator.

5. The method as set forth in claim 1, wherein an electric power delivered to the power supply network by the generator prior to the network fault is detected as an operating parameter, wherein excitation is reduced based on the delivered electric power prior to the network fault.

6. The method as set forth in claim 5, wherein excitation is reduced substantially proportionally to a difference in the delivered electric power prior to the network fault in relation to a predeterminable reference value.

7. The method as set forth in claim 1, wherein a transient rotary speed of at least one of (i) the generator, (ii) the coupling device, and (iii) the internal combustion engine is detected as the operating parameter during the network fault, wherein excitation is reduced substantially proportionally to a difference in the transient rotary speed relative to the rotary speed prior to the network fault.

8. The method as set forth in claim 1, wherein a change in rotary speed of at least one of (i) the generator, (ii) the coupling device, and (iii) the internal combustion engine is detected as the operating parameter during the network fault, wherein excitation is reduced based on the magnitude of the change in rotary speed.

9. The method as set forth in claim 1, wherein a torque at at least one of (i) an engine shaft of the internal combustion engine and (ii) at a rotor shaft of the generator is detected as the operating parameter during the network fault, wherein excitation is reduced based on the torque.

10. The method as set forth in claim 1, wherein a load angle of the generator is detected as the operating parameter during the network fault, wherein excitation is reduced substantially indirectly proportionally to the magnitude of the detected load angle.

11. The method as set forth in claim 1, wherein excitation is reduced at a maximum to a predeterminable minimum excitation.

12. The method as set forth in claim 1, wherein oscillations in an operating parameter of the generator during the network fault are detected, wherein excitation of the generator is reduced if the oscillations exceed a predeterminable intensity.

13. The method as set forth in claim 12, wherein oscillations in a load angle of the generator are detected, wherein excitation of the generator is reduced if the oscillations are of an amplitude of more than 2 degrees.

14. The method as set forth in claim 13, wherein oscillations in a load angle of the generator are detected, wherein excitation of the generator is reduced if the oscillations are of an amplitude of more than 10 degrees.

15. The method as set forth in claim 2, wherein the generator has an inertia constant of less than or equal to 1 Ws/VA.

16. The method as set forth in claim 6, wherein the predeterminable reference value rated power.

17. A method of operating a generator connected to a power supply network during a network fault in the power supply network, said method comprising:
 at least temporarily reducing electric excitation of the generator based on a value of at least one operating parameter of the generator at at least one point in time (i) prior to the network fault or (ii) during the network fault;
 wherein said at least temporarily reducing electric excitation of the generator comprises:
  ascertaining a reduced maximum voltage based on the value of the at least one operating parameter of the generator at the at least one point in time (i) prior to the network fault or (ii) during the network fault; and
  outputting the reduced maximum voltage as a maximum exciter voltage to a voltage regulator of an excitation device of the generator to limit an exciter current provided by the excitation device for the exciter windings on a rotor of the generator.

18. The method as set forth in claim 17, wherein a load angle of the generator is detected as the operating parameter during the network fault, wherein excitation is reduced substantially indirectly proportionally to the magnitude of the detected load angle.

19. The method as set forth in claim 17, wherein oscillations in an operating parameter of the generator during the network fault are detected, wherein excitation of the generator is reduced if the oscillations exceed a predeterminable intensity.

20. The method as set forth in claim 19, wherein oscillations in a load angle of the generator are detected, wherein excitation of the generator is reduced if the oscillations are of an amplitude of more than 2 degrees.

* * * * *